United States Patent
You et al.

(10) Patent No.: US 9,897,664 B2
(45) Date of Patent: Feb. 20, 2018

(54) METHOD AND APPARATUS FOR ESTIMATING STATE OF BATTERY

(71) Applicant: SAMSUNG ELECTRONICS CO., LTD., Suwon-si (KR)

(72) Inventors: Kaeweon You, Seoul (KR); SangDo Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 259 days.

(21) Appl. No.: 14/719,551

(22) Filed: May 22, 2015

(65) Prior Publication Data

US 2016/0033582 A1  Feb. 4, 2016

(30) Foreign Application Priority Data

Jul. 30, 2014 (KR) .................. 10-2014-0097153

(51) Int. Cl.
*G01N 27/416* (2006.01)
*H02J 7/00* (2006.01)
*G01R 31/36* (2006.01)
*G06K 9/00* (2006.01)

(52) U.S. Cl.
CPC ..... *G01R 31/3679* (2013.01); *G01R 31/3637* (2013.01); *G01R 31/3651* (2013.01); *G01R 31/3675* (2013.01); *G06K 9/00536* (2013.01)

(58) Field of Classification Search
CPC ................................................ G01R 31/3679
USPC ........................................................ 320/132
See application file for complete search history.

(56) References Cited

U.S. PATENT DOCUMENTS

| 8,258,751 | B2 | 9/2012 | Esnard |
| 2006/0276980 | A1* | 12/2006 | Mizuno ............. G01R 31/3648 702/63 |
| 2011/0191278 | A1 | 8/2011 | Song et al. |
| 2013/0069660 | A1 | 3/2013 | Bernard et al. |
| 2014/0084867 | A1 | 3/2014 | Hamaoka et al. |

FOREIGN PATENT DOCUMENTS

| EP | 2 204 873 A1 | 7/2010 |
| JP | 4864383 B2 | 2/2012 |
| JP | 5297751 B2 | 9/2013 |
| KR | 10-2011-0084633 A | 7/2011 |

(Continued)

OTHER PUBLICATIONS

Hu, X. et al., "Fuzzy clustering based multi-model support vector regression state of charge estimator for lithium-ion battery of electric vehicle," 2009 International Conference on Intelligent Human-Machine Systems and Cybernetics, IEEE, 2009 (5 pages in English).

(Continued)

*Primary Examiner* — Edward Tso
*Assistant Examiner* — Ahmed Omar
(74) *Attorney, Agent, or Firm* — NSIP Law

(57) ABSTRACT

A battery state estimation apparatus includes a sensing data acquirer configured to acquire sensing data of a battery. The apparatus further includes a state of health (SOH) information estimator configured to divide the sensing data based on a predetermined time interval, extract a segment comprising a predetermined number of items of the divided sensing data, and estimate SOH information of the battery based on the segments.

23 Claims, 15 Drawing Sheets

(56) References Cited

FOREIGN PATENT DOCUMENTS

| KR | 10-1232786 B1 | 2/2013 | | |
|---|---|---|---|---|
| KR | 10-2013-0089360 A | 8/2013 | | |
| WO | WO 2009/158225 A2 * | 12/2009 | ............. | G01R 31/36 |

OTHER PUBLICATIONS

Extended European Search Report issued in counterpart European Application No. 15178250.5 dated Dec. 4, 2015 (9 pages in English).

* cited by examiner

METHOD AND APPARATUS FOR ESTIMATING STATE OF BATTERY

CROSS-REFERENCE TO RELATED APPLICATION

This application claims the benefit under 35 USC 119(a) of Korean Patent Application No. 10-2014-0097153, filed on Jul. 30, 2014, in the Korean Intellectual Property Office, the entire disclosure of which is incorporated herein by reference for all purposes.

BACKGROUND

1. Field

The following description relates to a method and an apparatus for estimating a state of a battery.

2. Description of Related Art

As environmental concerns and energy resource issues become more important, an electric vehicle (EV) has been highlighted as a vehicle of the future. The EV may not emit exhaust gas, and may produce much less noise because a battery formed in a single pack with a plurality of rechargeable and dischargeable secondary cells is used as a main power source in the EV.

In the EV, the battery may function as a fuel tank and an engine of a gasoline powered vehicle. Thus, to enhance a safety of a user of the EV, checking a state of the battery may be important.

Research is being conducted to increase a convenience of the user while more accurately monitoring the state of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery state estimation apparatus including a sensing data acquirer configured to acquire sensing data of a battery, and a state of health (SOH) information estimator configured to divide the sensing data based on a predetermined time interval, extract a segment including a predetermined number of items of the divided sensing data, and estimate SOH information of the battery based on the segments.

The sensing data may include any one or any combination of voltage data, current data, temperature data, pressure data, and humidity data of the battery, which are sensed by a sensor configured to sense the battery.

The sensing data acquirer may be configured to update the sensing data based on an update cycle.

The sensing data acquirer may be configured to acquire the sensing data based on a control signal received from an external source.

The SOH information estimator may be configured to generate a segment vector based on the divided sensing data included in the segment.

The SOH information estimator may be configured to generate the segment vector for each item of the sensing data.

The SOH information estimator may be configured to map the segment vector to a feature space of which a dimension is lower than a dimension of the segment vector, based on a predetermined mapping parameter, and convert the mapped segment vector into a feature vector having a dimension equal to the dimension of the feature space.

The SOH information estimator may be configured to apply the feature vector and a predetermined learning parameter to a predetermined learning model to estimate a remaining capacity of the battery, and estimate the SOH information of the battery based on the remaining capacity of the battery.

The SOH information estimator may be configured to apply the feature vector, a pre-estimated remaining capacity of the battery, and the predetermined learning parameter to the predetermined learning model to estimate the remaining capacity of the battery.

The SOH information estimator may be configured to acquire either one or both of the predetermined mapping parameter and the predetermined learning parameter from an external source.

The size of the segment may be between 1000 and between 9000 seconds, or 3000 and 9000 seconds.

The SOH information estimator is configured to extract the segment from two or more of voltage data, current data, temperature data, pressure data, and humidity data of the battery.

In another general aspect, there is provided a battery state estimation apparatus including a sensing data acquirer configured to acquire sensing data of a battery; and a state of health (SOH) information estimator configured to periodically estimate SOH information of the battery and perform the estimating based on processed data generated by processing the sensing data and previous SOH information of the battery estimated in a previous cycle.

The battery state estimation apparatus comprise a buffer configured to store the previous SOH information.

The processed data comprises any one or any combination of divided sensing data into which the sensing data is divided based on a predetermined time interval, a segment including a predetermined quantity of divided sensing data, a segment vector generated based on the divided sensing data included in the segment, and a feature vector into which the segment vector is converted.

The SOH information estimator is configured to generate the segment based on an estimation cycle of the SOH information.

The SOH information estimator is configured to apply the previous SOH information and the processed data to a learning model, and estimate the SOH information of the battery based on a result of the applying.

In yet another general aspect, there is provided a battery state estimation method including acquiring sensing data of a battery, dividing the sensing data based on a predetermined time interval, extracting a segment including a predetermined number of items of the divided sensing data, and estimating state of health (SOH) information of the battery based on the segments.

In still another general aspect, there is provided an apparatus including a processor configured to divide data of a battery into items based on a predetermined time interval, extract a segment including a predetermined number of the items, and estimate a remaining capacity of the battery based on the segment.

The processor may be configured to generate a vector including the predetermined number of the items included in the segment, and estimate the remaining capacity based on the vector.

The processor may be configured to estimate the remaining capacity of the battery during a partial charging or discharging of the battery.

The processor may be configured to estimate the remaining capacity of the battery further based on a pre-estimated remaining capacity of the battery.

Other features and aspects will be apparent from the following detailed description, the drawings, and the claims.

Figure 1:
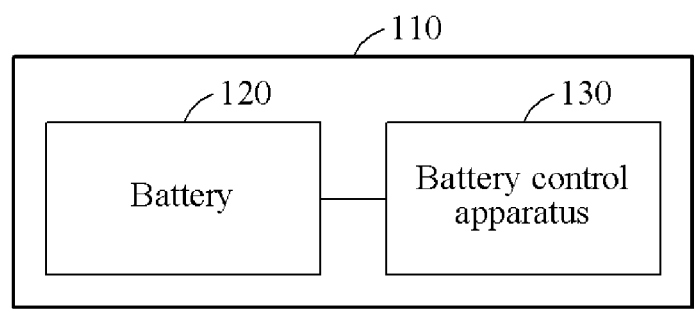
FIG. 1 is a block diagram illustrating an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a block diagram illustrating a battery system 110. Referring to FIG. 1, the battery system 110 includes a battery 120 and a battery control apparatus 130, for example, a battery management system (BMS). The battery 120 may supply power to a driving device, for example, an electric vehicle (EV) including a battery system 110, and may include a plurality of battery modules. Each of the plurality of battery modules may include a plurality of cells. The plurality of battery modules may be connected to one another in parallel, in series, or a combination of both. The plurality of battery modules may be secondary batteries, for example, lithium ion batteries. Also, a capacity for each of the plurality of battery modules may be identical to or different from one another. The battery system 110 may refer to an energy storage system (ESS).

The battery control apparatus 130 monitors a state of the battery 120, and controls the battery 120. The battery control apparatus 130 may perform a thermal control of the plurality of battery modules in the battery 120. Also, the battery control apparatus 130 may prevent the battery 120 from being overcharged and overdischarged, and control the plurality of battery modules to be in equal charge states by performing cell balancing. Accordingly, an energy efficiency of the battery 120 may increase, and a life of the battery 120 may be extended.

Also, the battery control apparatus 130 may estimate state of health (SOH) information, state of charge (SOC) information, state of function (SOF) information, and/or other information of the plurality of battery modules. The SOH information may indicate a degree of degradation in a performance of the battery 120, in comparison to a performance provided in production of the battery 120. The SOC information may indicate information of an amount of charges held in the battery 120, and the SOF information may indicate information of a degree to which the performance of the battery 120 matches a predetermined condition.

The battery control apparatus 130 may provide the SOH information, the SOC information, and the SOF information to an electronic control unit (ECU). In an example, the battery control apparatus 130 may communicate with the ECU based on a controller area network (CAN) communication.

To estimate the SOH information of the battery 120, the battery control apparatus 130 may use a predetermined SOH information estimation method. For example, the battery control apparatus 130 may estimate the SOH information based on an open circuit voltage (OCV) method through which an open voltage of the battery 120 is measured to estimate the SOH information. In another example, the battery control apparatus 130 may estimate the SOH information based on an electrochemical impedance spectroscopy (EIS) method through which an internal resistance of the battery 120 is measured to estimate the SOH information. In these examples, the OCV method and the EIS method may be performed while the battery 120 is in an electrically stable state. As another example, the battery control apparatus 130 may estimate the SOH information based on a constant current charging time (CCCT) method of estimating the SOH information by detecting a CCCT of the battery 120. The CCCT method may be performed when the battery 120 is fully charged and discharged. Hereinafter, full charging and full discharging may refer to charging and discharging of the battery 120 such that a voltage level of the battery 120 reaches a fully charged level and a fully discharged level, respectively. Also, partial charging and partial discharging may refer to charging and discharging the battery 120 such that the voltage level of the battery 120 does not reach the fully charged level and the fully discharged level, respectively.

When the battery 120 is partially charged and discharged, the battery control apparatus 130 may sense the state of the battery 120, and recognize a degradation pattern of the battery based on the sensed state of the battery 120, thereby estimating the SOH information of the battery 120. In an example, the battery control apparatus 130 may acquire sensing data of the battery 120. The sensing data may include at least one of voltage data, current data, temperature data, pressure data, and humidity data. Also, the sensing data may include all data indicating the state of the battery 120.

The battery control apparatus 130 may divide the acquired sensing data based on a predetermined time interval, and may extract a plurality of segments including the divided sensing data based on a predetermined segment interval. In this example, each of the plurality of segments may include a predetermined number of items of divided sensing data, and may be extracted time-sequentially. The battery control apparatus 130 may estimate the SOH information of the battery 120 by recognizing the degradation pattern of the battery 120 based on the plurality of segments. In an example, the battery control apparatus 130 may estimate the SOH information by applying a predetermined learning model to the plurality of segments. In this example, a parameter applied to the plurality of segments may be stored in advance or received from a preprocessor (not shown) for application of the predetermined learning model.

Figure 2:
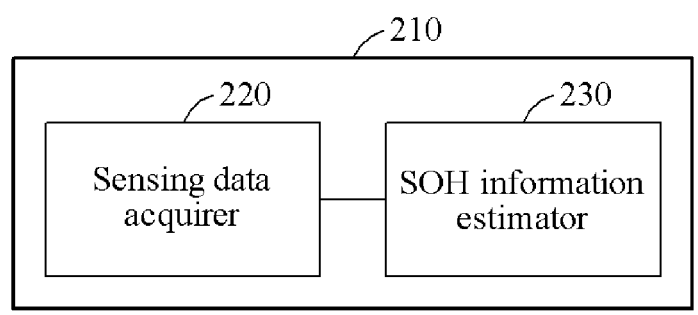
FIG. 2 is a block diagram illustrating an example of a battery state estimation apparatus.

FIG. 2 is diagram illustrating a battery state estimation apparatus 210. Referring to FIG. 2, the battery state estimation apparatus 210 includes a sensing data acquirer 220 and an SOH information estimator 230. In an example, the battery state estimation apparatus 210 may correspond to the battery control apparatus 130 of FIG. 1 or an element included in the battery control apparatus 130.

The sensing data acquirer 220 acquires sensing data of a battery. The sensing data may include at least one of voltage data acquired from a voltage sensor, current data acquired from a current sensor, temperature data acquired from a temperature sensor, pressure data acquired from a pressure sensor, and humidity data acquired from a humidity sensor. Each of the voltage sensor, the current sensor, the temperature sensor, the pressure sensor, and the humidity sensor may sense the battery. Also, the sensing data may include data acquired from sensors that sense the battery, other than the aforementioned sensors.

In an example, the sensing data may indicate time-series data sensed during a predetermined time period. For example, the voltage sensor may sense a voltage of the battery during ten seconds under a control of the sensing data acquirer 220, and the sensing data acquirer 220 may acquire the sensing data from the voltage sensor. The sensing data acquirer 220 may provide the acquired sensing data to the SOH information estimator 230.

In another example, the sensing data acquirer 220 may update the sensing data based on an update cycle. For example, when the update cycle is 24 hours, the sensing data acquirer 220 may acquire the sensing data from a sensor that senses the battery at an interval of 24 hours. The update cycle may be set in advance, or variably set by an external source. The external source may refer to another apparatus in lieu of the battery state estimation apparatus 210.

In still another example, the sensing data acquirer 220 may acquire the sensing data based on a control signal received from the external source. For example, when a control signal instructing a battery state estimation is received from the external source, in response to the control signal, the sensing data acquirer 220 may receive the sensing data from the sensor that senses the battery.

The SOH information estimator 230 extracts a plurality of segments from the sensing data acquired by the sensing data acquirer 220, and estimates SOH information of the battery based on the plurality of segments. The SOH information estimator 230 may divide the sensing data based on a predetermined time interval. For example, when the predetermined time interval is ten seconds, and when a sensing time of the sensing data is 100 seconds, the SOH information estimator 230 may divide the sensing data into 11 items (0 seconds, 10 seconds, . . . , 90 seconds, and 100 seconds). The predetermined time interval may be adjusted depending on an example. In this example, a segment may refer to a processing unit used by the SOH information estimator 230 to process the sensing data in order to estimate the SOH information of the battery. The SOH information estimator 230 may extract the plurality of segments from the sensing data based on a predetermined segment section. Each of the plurality of segments may include a predetermined number of items of the divided sensing data, and may be extracted time-sequentially. In this example, the predetermined number may refer to the number of items of the divided sensing data included in the segment, and may be expressed as a segment size. The predetermined segment section may refer to an interval between starting points of two consecutive segments, and may be expressed as a segment interval.

The SOH information estimator 230 may extract a plurality of items of segment data sequentially based on a point in time of segment extraction. In this example, the point in time of segment extraction may indicate a point in time at which sensing of the sensing data is initiated or a point in time at which the control signal instructing the battery state estimation is received from the external source. When the number of items of the divided sensing data corresponding to the segment interval is less than the segment size, the two consecutive segments may include, in duplicate, a number of items of sensing data divided to correspond to a difference between the segment size and the number of items of sensing data divided to correspond to the segment interval. For example, when the sensing data is divided into 10 items at an interval of 10 seconds, the point in time of segment extraction is a point in time of 10 seconds, the segment size is four, and the segment interval is 10 seconds, the SOH information estimator 230 may consecutively extract seven segments, starting from the point in time of 10 seconds. For example, a first segment may include items of sensing data divided to correspond to points in time of 10, 20, 30, and 40 seconds. A second segment may include items of sensing data divided to correspond to points in time of 20, 30, 40, and 50 seconds. In this example, the first segment and the second segment may include three items of sensing data divided to correspond to the points in time of 20, 30, and 40 seconds in duplicate. As another example, when the sensing data is divided into 10 items, the point in time of segment extraction is the point in time of 10 seconds, the segment size is three, and the segment interval is 40 seconds, the SOH information estimator 230 may consecutively extract two segments from the point in time of 10 seconds. In this example, the first segment may include items of sensing data divided to correspond to points in time of 10, 20, and 30 seconds, and the second segment may include items of sensing data divided to correspond to points in time of 50, 60, and 70 seconds. Thus, the first segment and the second segment may not include duplicated items of sensing data.

In an example, the SOH information estimator 230 may adjust a segment parameter, for example, the point in time of segment extraction, the segment interval, and the segment size. Through this, a quantity of data included in the segment and a speed of generating the segment may be adjusted. As an example, the SOH information estimator 230 may set the segment parameter, or receive information of the segment parameter from the external source, for example, a preprocessing apparatus.

In addition, the SOH information estimator 230 may generate a segment vector including the divided sensing data included in each of the plurality of segments as an element. In an example, the SOH information estimator 230 may generate a plurality of segment vectors corresponding to the plurality of segments. For example, when the first segment includes a first sensing value corresponding to the point in time of 10 seconds and a second sensing value corresponding to the point in time of 20 seconds, and when the second segment includes a third sensing value corresponding to the point in time of 30 seconds and a fourth segment corresponding to the point in time of 40 seconds, the SOH information estimator 230 may generate a first segment vector including the first sensing value and the second sensing value as elements, and a second segment vector including the third sensing value and the fourth sensing value as elements.

In another example, the SOH information estimator 230 may generate a single segment vector corresponding to the plurality of segments. Similar to the aforementioned example, when the first segment includes the first sensing value and the second sensing value, and when the second segment includes the third sensing value and the fourth sensing value, the SOH information estimator 230 may generate a single segment vector including the first sensing value, the second sensing value, the third sensing value, and the fourth sensing value.

When a plurality of items of sensing data is provided, the SOH information estimator 230 may generate the segment vector for each of the plurality of items of sensing data. For example, the sensing data acquirer 220 may acquire voltage data, current data, and temperature data of the battery. In this example, the SOH information estimator 230 may extract the plurality of segments for each of the voltage data, the current data, and the temperature data, and generate the segment vector corresponding to each of the voltage data, the current data, and the temperature data based on the divided sensing data included in each of the plurality of segments.

In an example, the SOH information estimator 230 may generate a single segment vector corresponding to the plurality of items of sensing data. Similar to the aforementioned example, when the sensing data acquirer 220 acquires the voltage data, the current data, and the temperature data on the battery, the SOH information estimator 230 may extract the plurality of segments from each of the voltage data, the current data, and the temperature data. The SOH information estimator 230 may generate a voltage data block including the plurality of segments corresponding to the voltage data, a current data block including the plurality of segments corresponding to the current data, and a temperature data block including the plurality of segments corresponding to the temperature data. Subsequently, the SOH information estimator 230 may combine the voltage data block, the current data block, and the temperature data block, thereby generating a single segment vector.

In addition, the SOH information estimator 230 may map the segment vector to a feature vector based on a predetermined mapping parameter, and convert the mapped segment vector into a feature vector of which a dimension corresponds to a dimension of a feature space. The feature space may refer to a space in which the sensing data is expressed based on a low dimension. Thus, the feature space may have a dimension lower than a dimension of the segment vector. As an example, the SOH information estimator 230 may set the predetermined mapping parameter or receive information of the predetermined mapping parameter from the external source, for example, the preprocessing apparatus, using a communication interface (not shown). The dimension of the feature space may be determined based on the predetermined mapping parameter. By mapping the segment vector to a predetermined feature space, high-dimensional data may be compressively expressed in a low-dimensional orthogonal space while minimizing a data loss. Accordingly, an operation amount of the SOH information estimator 230 may be reduced in a process of estimating the state of the battery, and noise may be eliminated from the segment vector.

In an example, the predetermined mapping parameter may include a predetermined reference matrix. The SOH information estimator 230 may project the segment vector onto the predetermined reference matrix, and map the projected segment vector to the predetermined feature space, thereby extracting the feature vector having a dimension corresponding to a dimension of the predetermined feature space. For example, the SOH information estimator 230 may acquire a principle component analysis (PCA) basis matrix from the preprocessing apparatus. The SOH information estimator 230 may map the segment vector to a PCA feature space by projecting the segment vector onto the PCA basis matrix. Through this, the segment vector may be converted into the feature vector in the PCA feature space.

In addition, the SOH information estimator 230 may estimate a remaining capacity of the battery by inputting the feature vector to a predetermined learning model. The predetermined learning model may include at least one of a neural network (NN) model, a support vector regression (SVM) model, and a Gaussian process regression model. Also, the predetermined learning model may include another learning model for estimating the remaining capacity of the battery by using the feature vector in lieu of the NN model, the SVM model, and the Gaussian process regression model. In an example, the SOH information estimator 230 may estimate the remaining capacity of the battery by extracting a degradation model of the battery from the predetermined learning model to which the feature vector is input.

Also, the SOH information estimator 230 may estimate the remaining capacity by inputting pre-estimated information of the remaining capacity of the battery and the feature vector to the predetermined learning model. Through this, an error may be reduced in a result value of estimating the remaining capacity of the battery. In an example, the SOH information estimator 230 may convert the pre-estimated information of the remaining capacity of the battery into a form of the feature vector, and input the converted feature vector and the feature vector corresponding to the plurality of segments, to the predetermined learning model.

To improve accuracy in the estimating of the remaining capacity, the SOH information estimator 230 may apply a predetermined learning parameter to the predetermined learning model. For example, when the predetermined learning model is the NN model, the predetermined learning parameter may include activation functions, a weighted value, and a connected pattern among neurons. When the predetermined learning model is the SVM model, the predetermined learning parameter may include kernel functions and penalty parameters. When the predetermined learning model is the Gaussian process regression model, the predetermined learning parameter may include the kernel functions and hyper-parameters.

In an example, the SOH information estimator 230 may set the predetermined learning parameter, or receive information of the predetermined learning parameter from the external source, for example, the preprocessing apparatus using the communication interface (not shown).

The SOH information estimator 230 may extract SOH information of the battery based on the estimated remaining capacity of the battery. In an example, the SOH information may be computed by using Equation 1.

$$SoH = \frac{C_e}{C_1} \quad \text{[Equation 1]}$$

In Equation 1, SoH denotes the SOH information of the battery, $C_1$ denotes a capacity provided in production of the battery, and $C_e$ denotes the estimated remaining capacity of the battery. For example, when the capacity provided in production of the battery is 50 kilowatts (kWh) and the estimated remaining capacity of the battery is 40 kWh, the SOH information estimator 230 may operate the SOH information as 0.8. In an example, the SOH information estimator 230 may periodically estimate the SOH of the battery, and the estimating may be performed based on processed data generated by processing sensing data and a previous SOH estimated in a previous cycle. For example, an estimated $SOH_{i-1}$ in a period T-1 may be stored in a buffer. When a period T arrives, the SOH information estimator 230 may estimate $SOH_i$ of the battery based on the processed data and $SOH_{i-1}$ stored in the buffer.

The processed data may include at least one of, for example, divided sensing data obtained by dividing the sensing data based on a predetermined time interval, a segment including a predetermined quantity of the divided sensing data, a segment vector generated based on the divided sensing data included in the segment, and a feature vector into which the segment vector is converted. The SOH information estimator 230 may generate the divided sensing data by dividing the sensing data based on the predetermined time interval, and generate the segment including the predetermined quantity of divided sensing data. Also, the SOH information estimator 230 may generate the segment vector based on the divided sensing data included in the segment, and generate the feature vector by projecting the segment vector onto a feature space. Since the aforementioned descriptions are also applicable to the divided sensing data, the segment, the segment vector, and the feature vector and thus, repeated descriptions will be omitted for increased clarity and conciseness.

An estimation cycle of the SOH information on the battery may correspond to the aforementioned segment interval. As an example, when the segment interval is 500 seconds, the SOH information estimator 230 may generate the segment and estimate the SOH information on the battery at an interval of 500 seconds. When the estimation cycle or the segment interval is set to be relatively short, the SOH information of the battery may be estimated in real time.

The SOH information estimator 230 may use a plurality of items of previous SOH information estimated in the previous estimation cycle to estimate the SOH information of the battery. For example, the SOH information estimator 230 may use $SOH_{i-1}$, $SOH_{i-2}$, and $SOH_{i-3}$ stored in the buffer to estimate $SOH_i$. A feedback on previously estimated SOH information may be provided to estimate current SOH information of the battery.

The SOH information estimator 230 may apply the previous SOH information and the processed data to a learning model, and estimate the SOH information of the battery based on a result of the applying. For example, the feature vector may be applied to the learning model as well as the precious SOH information. As described above, the learning model may include, for example, NN model.

In the battery state estimation apparatus 210, the SOH of the battery may be updated periodically. In response to an request from a user, the battery state estimation apparatus 210 may provide the most recent SOH to the user. In the aforementioned example, when $SOH_i$ of the battery is estimated, the battery state estimation apparatus 210 may store $SOH_i$ in the buffer. Also, in response to an SOH request from a user, the battery state estimation apparatus 210 may provide the user with $SOH_i$ estimated most recently from a time at which the SOH request is received.

Figure 3:
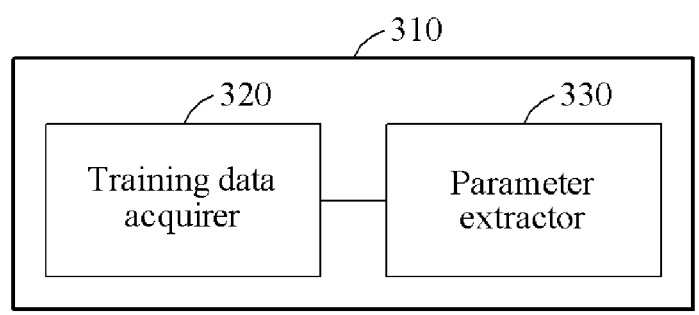
FIG. 3 is a block diagram illustrating an example of a preprocessing apparatus.

FIG. 3 is a block diagram illustrating an example of a preprocessing apparatus 310. Referring to FIG. 3, the preprocessing apparatus 310 includes a training data acquirer 320 and a parameter extractor 330. The training data acquirer 320 acquires a plurality of items of training data of a battery. The training data may include at least one of voltage data, current data, temperature data, pressure data, and humidity data. Also, the training data may include all data indicating a state of the battery. The training data acquirer 320 may acquire the plurality of items of training data of a single battery, or acquire the plurality of items of training data of each of a plurality of batteries. In an example, the training data acquirer 320 may acquire the plurality of items of training data from a predetermined database and/or an external device. For example, the training data acquirer 320 may update the plurality of items of training data from the predetermined database and/or the external device based on an update cycle, and/or may acquire the plurality of items of training data from the predetermined database and/or the external device based on a control signal received from an external source.

The parameter extractor 330 extracts a plurality of training segments from the plurality of items of training data acquired by the training data acquirer 320, and extracts a parameter for estimating SOH information of the battery, based on the plurality of training segments. In an example, the parameter for estimating the SOH information of the battery may include a mapping parameter and/or a learning parameter that are used to estimate the SOH information of the battery in a battery state estimation apparatus.

The parameter extractor 330 may divide each item of the training data based on a predetermined time interval. For example, when three items of the training data is provided, the predetermined time interval is five seconds, and a sensing time of the plurality of items of the training data is 30 seconds, the parameter extractor 330 may divide each of the three items of the training data into seven items to correspond to points in time of 0, 5, 10, 15, 20, 25, and 30 seconds. The predetermined time interval may be adjusted depending on an example. The parameter extractor 330 may extract the plurality of training segments from each item of the training data. In this example, a training segment may refer to a processing unit used by the parameter extractor 330 to process the plurality of items of the training data in order to extract the parameter for estimating the SOH information of the battery. The parameter extractor 330 may extract the plurality of training segments from each item of the training data based on a predetermined training segment section. Each of the plurality of training segments may include a predetermined number of items of the divided training data, and may be extracted time-sequentially. In this example, the predetermined number may refer to the number of items of the divided training data that is included in the training segment, and may be expressed as a training segment size. The predetermined training segment section may refer to an interval between starting points of two consecutive training segments, and may be expressed as a training segment interval.

The parameter extractor 330 may sequentially extract a plurality of items of segment data from each item of the training data based on a point in time of training segment extraction. In this example, the point in time of training segment extraction may refer to a predetermined point in time or a point in time set by the external source. When the number of items of the divided training data corresponding to the training segment interval is less than the segment size, the two consecutive training segments may include, in duplicate, a number of items of training data divided to correspond to a difference between the training segment size and the number of items of training data divided to correspond to the training segment interval. In an example, the parameter extractor 330 may adjust a training segment parameter, for example, the point in time of training segment extraction, the training segment interval, and/or the training segment size. Through this, a quantity of data included in the training segment and a speed of generating the training segment may be adjusted.

In addition, the parameter extractor 330 may generate a training segment vector for each item of the training data based on the divided training data included in each of the plurality of training segments. In this example, the training segment vector may include the divided training data as elements. The parameter extractor 330 may generate a plurality of training segment vectors corresponding to the plurality of training segments.

Also, the parameter extractor 330 may extract an optimal mapping parameter from a plurality of mapping parameters stored in advance. In an example, the parameter extractor 330 may map the training segment vector to a feature space having a dimension lower than a dimension of the training segment vector, and convert the training segment vector into a training feature vector having a dimension corresponding to the feature space. Through this, the parameter extractor 330 may extract a mapping parameter for minimizing a restore error of the training feature vector from the plurality of mapping parameters. For example, the parameter extractor 330 may project the training segment vector to each of a first PCA basis matrix, a second PCA basis matrix, and a third PCA basis matrix, and generate a first training feature vector, a second training feature vector, and a third training feature vector, respectively. The parameter extractor 330 may invert each of the first training feature vector, the second training feature vector, and the third feature vector to operate the restore error thereof. When the second training feature vector has a smallest restore error, the parameter extractor 330 may select the second PCA basis matrix as the optimal mapping parameter.

In addition, the parameter extractor 330 may extract an optimal learning parameter from a plurality of learning parameters stored in advance. In an example, the parameter extractor 330 may input the training feature vector to a predetermined learning model, and apply the plurality of learning parameters, thereby estimating a remaining capacity of the battery. In this example, the parameter extractor 330 may extract a learning parameter for minimizing a difference between an actual remaining capacity and the estimated remaining capacity, from the plurality of learning parameters. For example, the parameter extractor 330 may input the training feature vector to the NN model, and apply a first activation function, a second activation function, and a third activation function to the NN model. Through this, the parameter extractor 330 may extract a first estimated remaining capacity, a second estimated remaining capacity, and a third estimated remaining capacity by applying the first activation function, the second activation function, and the third activation function, respectively, to the NN model. The parameter estimator 330 may compare the actual remaining capacity to each of a first estimated remaining capacity, a second estimated remaining capacity, and a third estimated remaining capacity. When the third estimated remaining capacity is the most similar to the actual remaining capacity of the battery, the parameter extractor 330 may select the third activation function as the optimal learning parameter.

The parameter extractor 330 may transmit at least one of the optimal mapping parameter and the optimal learning parameter to the battery state estimation apparatus by using a communication interface (not shown). Accordingly, the battery state estimation apparatus may estimate the SOH information of the battery with increased speed and accuracy.

Figure 4:
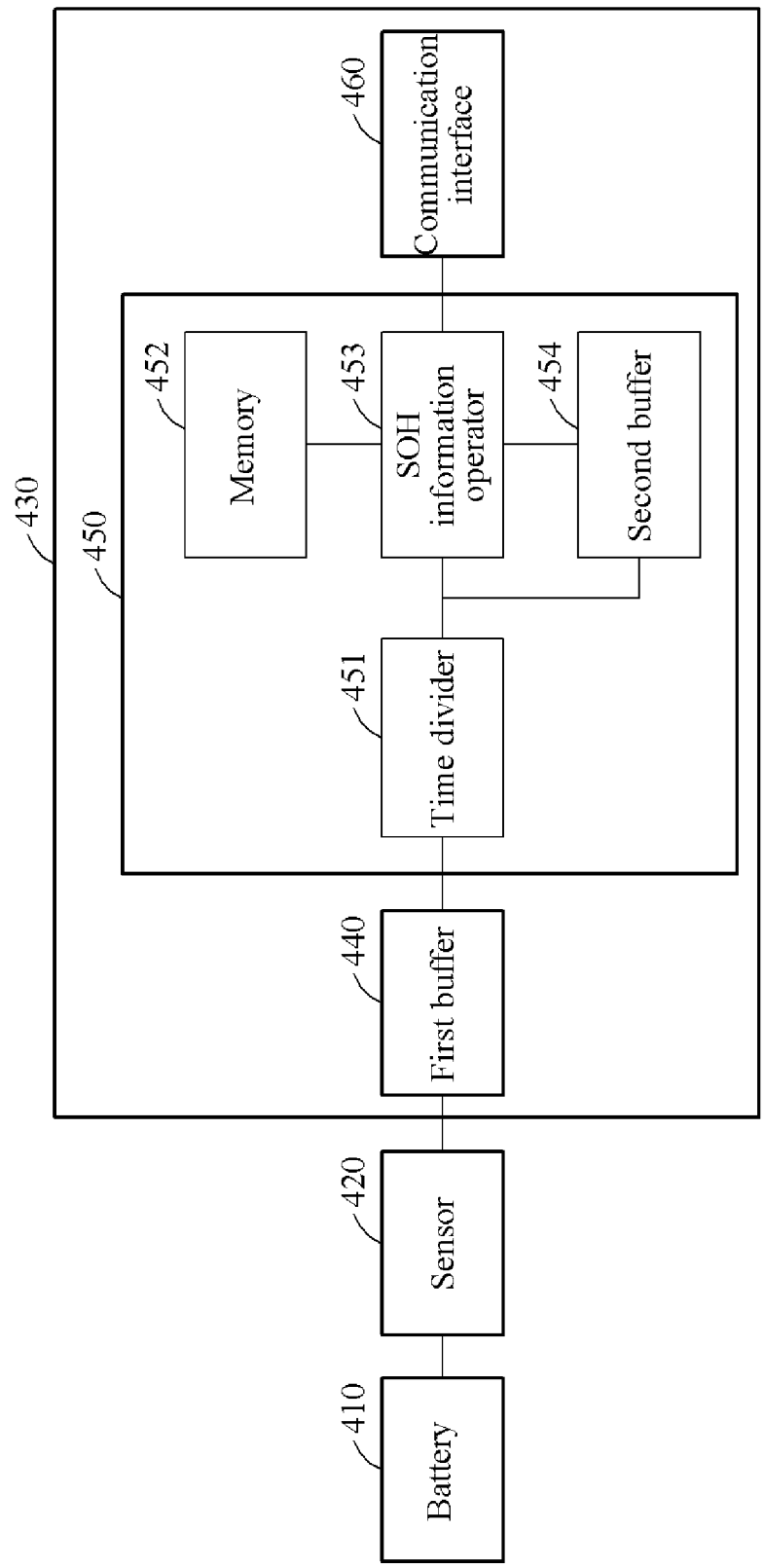
FIG. 4 is a block diagram illustrating another example of a battery state estimation apparatus.

FIG. 4 is a block diagram illustrating another example of a battery state estimation apparatus 430. Referring to FIG. 4, a battery system includes a battery 410, a sensor 420, and the battery state estimation apparatus 430. The battery 410 may include a plurality of battery modules. The sensor 420 senses a state of the battery 410 or states of the plurality of the battery modules. Although FIG. 4 shows a single sensor, the sensor 420 may be a plurality of sensors depending on an example. For example, the sensor 420 may be at least one of a voltage sensor, a current sensor, a temperature sensor, a pressure sensor, a humidity sensor, and other sensors that sense the state of the battery 410.

The battery state estimation apparatus 430 includes a first buffer 440, a controller 450, and a communication interface 460. The controller 450 includes a time divider 451, a memory 452, an SOH information operator 453, and a second buffer 454.

The first buffer 440 stores sensing data of the battery 410 that is acquired from the sensor 420 under a control of the controller 450. When the plurality of sensors is provided, the first buffer 440 may store a plurality of items of sensing data acquired from the plurality of sensors.

The communication interface 460 may include a wired interface and/or a wireless interface. The communication interface 460 receives a parameter for estimating the state of the battery 410 from an external processing apparatus. In an example, the communication interface 460 may receive a mapping parameter and/or a learning parameter from the external preprocessing apparatus. The communication interface 460 may store the received parameter in the memory 452.

The time divider 451 divides the sensing data stored in the first buffer 440 based on a predetermined time interval. The predetermined time interval may be adjusted depending on an example. Also, when the plurality of items of the sensing data is stored in the first buffer 440, the time divider 451 may divide each item of the sensing data based on the predetermined time interval.

The SOH information operator 453 extracts a plurality of segments from the sensing data, and extracts SOH information of the battery 410 based on the plurality of segments. The plurality of segments may include a number of items of the sensing data divided in the time divider 451 to correspond to the segment size. Also, the SOH information operator 453 may extract the plurality of segments for each segment interval based on a point in time of segment extraction. In this example, when the number of items of the divided sensing data corresponding to the segment interval is less than the segment size, two consecutive segments may include, in duplicate, a number of items of divided sensing data corresponding to a difference between the segment size and the number of items of the sensing data divided to correspond to the segment interval. In an example, the SOH information operator 453 may adjust a segment parameter, for example, the point in time of segment extraction, the segment interval, and the segment size. Also, the SOH information operator 453 may store the segment parameter in the memory 452.

The SOH information operator 453 may generate a segment vector including the divided sensing data included in each of the plurality of segments as elements. The SOH information operator 453 may generate a plurality of segment vectors corresponding to each of the plurality of segments, or generate a single segment vector corresponding to the plurality of segments. Also, when the plurality of items of the sensing data is provided, the SOH information operator 453 may generate a segment vector for each item of the sensing data, or generate a single item of the sensing data corresponding to the plurality of items of the sensing data.

The SOH information operator 453 may map the segment vector to a feature space having a dimension lower than a dimension of the segment vector based on a predetermined mapping parameter, and then convert the mapped segment vector into a feature vector having a dimension corresponding to the feature space. In this example, the predetermined mapping parameter may be stored in the memory 452. The predetermined mapping parameter may be a PCA basis matrix. The SOH information operator 453 may map the segment vector to a PCA feature space by projecting the segment vector to the PCA basis matrix. Through this, the segment vector may be converted into the feature vector in the PCA feature space.

The SOH information operator 453 may estimate a remaining capacity of the battery 410 by inputting the feature vector to a predetermined learning model. The predetermined learning model may include at least one of an NN model, an SVM model, and a Gaussian process regression model. The SOH information operator 453 may apply the predetermined learning parameter to the predetermined learning model. Thus, the SOH information operator 453 may more accurately estimate the remaining capacity of the battery 410 by extracting a degradation pattern of the battery 410 from the predetermined learning model to which the feature vector is input. Also, the SOH information operator 453 may estimate the remaining capacity of the battery 410 by inputting pre-estimated information of the remaining capacity of the battery 410 and the feature vector to the predetermined learning model. Thus, an error may be reduced in a result value of estimating the remaining capacity of the battery 410. The pre-estimated information of the remaining capacity of the battery 410 may be stored in the second buffer 454. The SOH information operator 453 may store the estimated information of the remaining capacity of the battery 410 in the second buffer 454. Accordingly, the currently estimated information of the remaining capacity of the battery 410 may be used for a subsequent battery state estimation.

The SOH information operator 453 may transmit the estimated information of the remaining capacity of the battery 410 to an external source, for example, an ECU, by using the communication interface 460.

Figure 5:
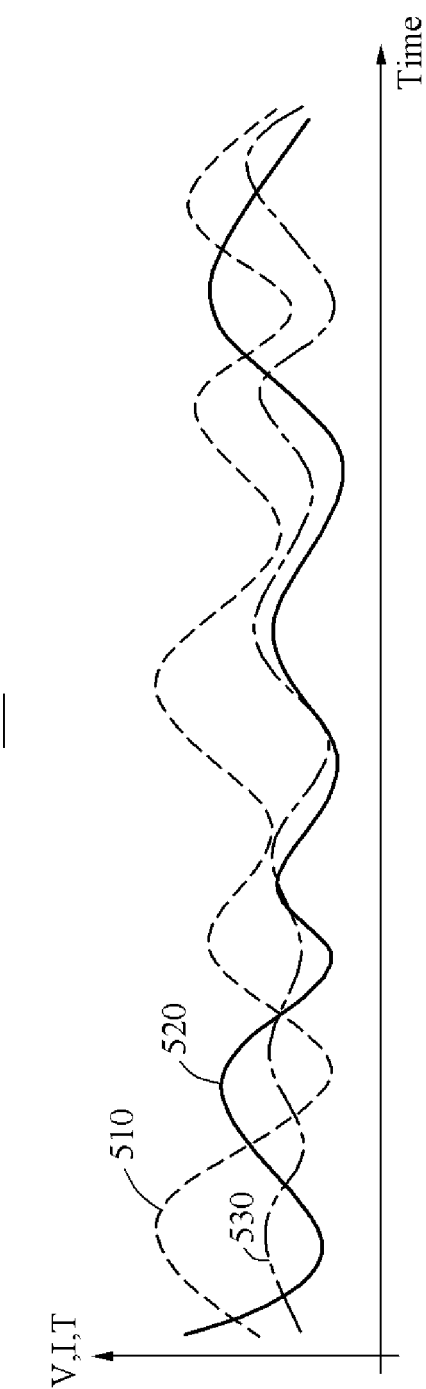
FIG. 5 is a diagram illustrating an example of partial charging and discharging.

FIG. 5 is a diagram illustrating an example of partial charging and discharging. Referring to FIG. 5, a graph 500 shows a battery state change in a process of partial charging and discharging. In the graph 500, a horizontal axis represents a time, and a vertical axis represents a voltage level, a current level, and a temperature level of a battery. For example, in the graph 500, the vertical axis may represent a voltage from 2.7 to 4.2 volts (V) when sensing data is voltage data as indicated by a dotted curve 510, the vertical axis may represent a current from −10 to 3 amperes (A) when the sensing data is current data as indicated by a solid curve 520, and the vertical axis may represent a temperature from 10 to 30° C. when the sensing data is temperature data as indicated by a dash-dot curve 530.

As shown in the graph 500, when the battery is partially charged and discharged, a level for each of the voltage data, the current data, and the temperature data may be changed within a predetermined threshold level. For example, when the sensing data is the voltage data, a voltage level may be changed in a range from 2.7 V corresponding to a fully discharged level to 4.2 V corresponding to a fully charged level.

In an example, a level changing pattern of the sensing data may vary based on an SOH of the battery. A battery state estimation apparatus may divide the sensing data based on a predetermined time interval, and extract a plurality of segments, each including a predetermined number of items of the divided sensing data, from the sensing data based on a predetermined segment interval, thereby recognizing a pattern of the sensing data. Each of the segments may be extracted time-sequentially.

Figure 6:
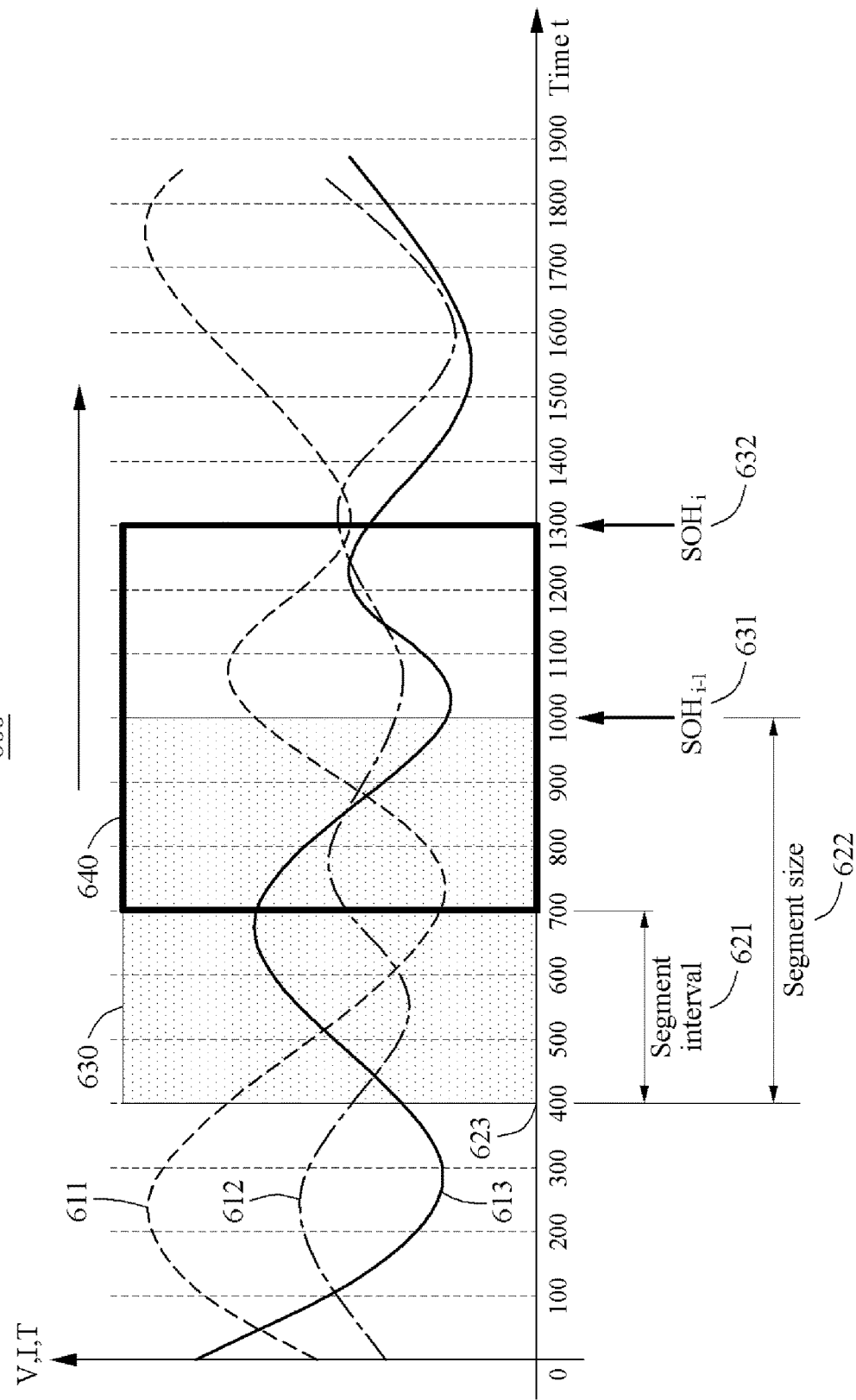
FIG. 6 is a diagram illustrating an example of a segment.

FIG. 6 is a diagram illustrating an example of a segment. Referring to FIG. 6, a graph 600 shows a battery state change in a process of partial charging and discharging. In the graph 600, a horizontal axis represents a time, and a vertical axis represents a voltage level, a current level, and a temperature level of a battery.

Based on a predetermined time interval, a battery state estimation apparatus divides voltage data indicated by a dotted curve 611, current data indicated by a dash-dot curve 612, and temperature data indicated by a solid curve 613. In this example, the battery state estimation apparatus divides sensing data, for example, the voltage data, the current data, and the temperature data, at an interval of 100 seconds. The battery state estimation apparatus may time-sequentially extract a plurality of segments, each including a predetermined number of items of the divided sensing data, based on a predetermined segment section, starting from a point in time of segment extraction as a starting point.

For example, when a segment size 622 is seven, and a segment interval 621 corresponding to the predetermined segment section is 300 seconds, the battery state estimation apparatus extracts a segment sequentially from a point in time of 400 seconds 623 corresponding to the point in time of segment extraction. A first segment 630 primarily extracted by the battery state estimation apparatus includes seven items of the sensing data divided to correspond to points in time of 400 through 1000 seconds. In this example, the divided sensing data includes a sensing value corresponding to each of points in time of 400, 500, 600, 700, 800, 900, and 1000 seconds. Also, a second segment 640 secondarily extracted by the battery state apparatus includes seven items of the sensing data divided to correspond to points in time of 700 through 1300 seconds. In this example, the divided sensing data includes a sensing value corresponding to each of points in time of 700, 800, 900, 1000, 1100, 1200, and 1300 seconds. Since the number of items of sensing data corresponding to the segment interval 621 is less than the segment size 622, each of the first segment 630 and the second segment 640 includes four items of the sensing data, for example, the sensing values corresponding to the points in time of 700, 800, 900, and 1000 seconds, in duplicate. The segment size may be determined based on a computability of a battery state estimation apparatus or a computability of a BMS including the battery state estimation apparatus. Although the examples in the FIG. 6 describe that the segment size is seven, this is merely one example, and other segment size may be used. For example, the segment size may be between 1000 and 9000 seconds or more specifically between 3000 and 9000 seconds.

In an example, the battery state estimation apparatus may estimate a state of the battery at an ending point of each segment. For example, the battery state estimation apparatus estimates first SOH information 631 ($SOH_{i-1}$) based on the first segment 630 at the point in time of 1000 seconds corresponding to an ending point of the first segment 630. Also, the battery state estimation apparatus estimates second SOH information 632 ($SOH_i$) based on the second segment 640 at the point in time of 1300 seconds corresponding to an ending point of the second segment 640. In an example, the battery state estimation apparatus estimates the second SOH information 632 based on the first SOH information 631 and the second segment 640. Through this, an error may be reduced in the second SOH information 632.

Figure 7A:
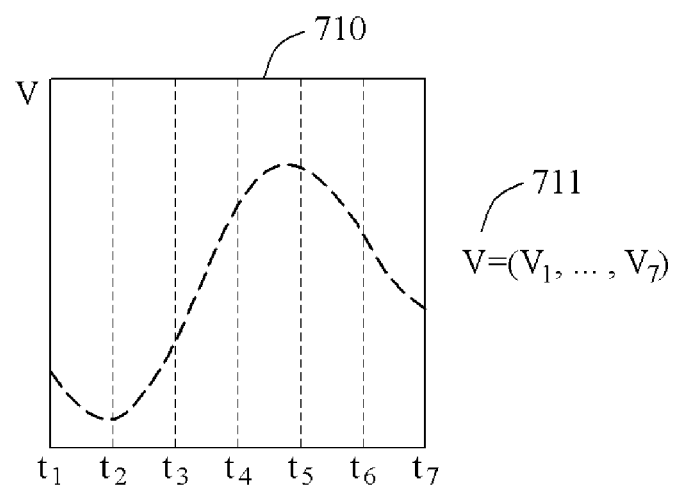
FIGS. 7A through 7C are diagrams illustrating examples of a segment vector.
Figure 7B:
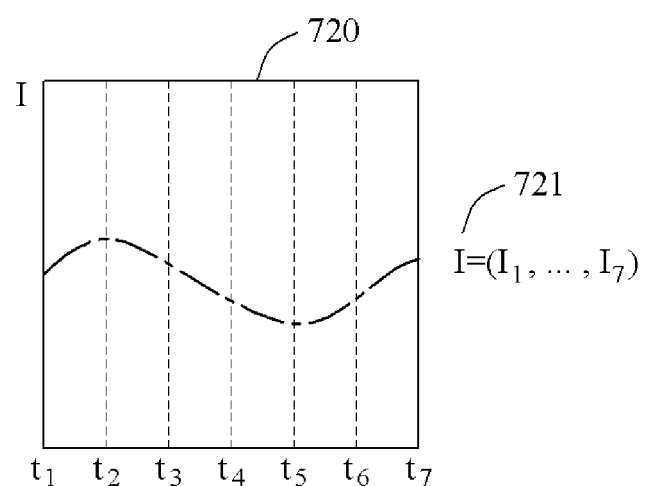
Figure 7C:
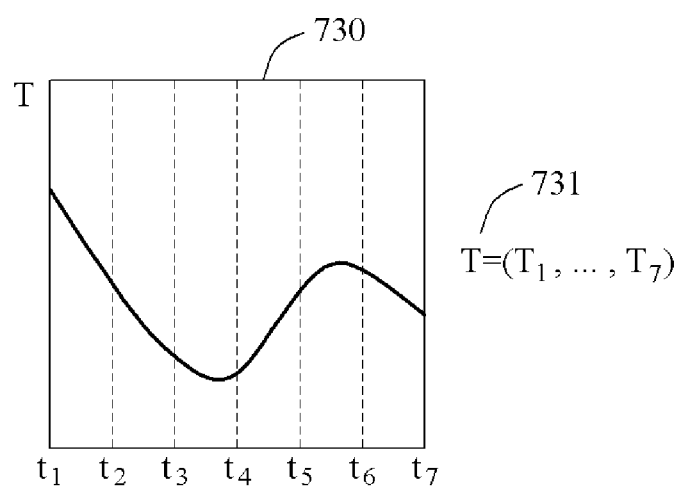

FIGS. 7A through 7C are diagrams illustrating examples of a segment vector. Referring to FIGS. 7A through 7C, a first segment 710 is extracted from voltage data, a second segment 720 is extracted from current data, and a third segment 730 is extracted from temperature data. In an example, a battery state estimation apparatus generates segment vector 711, 712, and 713 for the first segment 710, the second segment 720, and the third segment 730, respectively. The battery state estimation apparatus generates the segment vectors 711, 712, and 713 using sensing values corresponding to points in time of the segments 710, 720, and 730 as elements. For example, the first segment 710 includes seven items of voltage data, and has sensing values of 3.2 V, 2.8 V, 3.5 V, 3.9 V, 4.1 V, 3.8 V, and 3.6 V corresponding to points in time $t_1$, $t_2$, $t_3$, $t_4$, $t_5$, $t_6$, and $t_7$, respectively. In this example, the battery state estimation apparatus generates the first segment vector 711 V including values of 3.2, 2.8, 3.5, 3.9, 4.1, 3.8, and 3.6 as elements $V_1$, $V_2$, $V_3$, $V_4$, $V_5$, $V_6$, and $V_7$, respectively.

In an example, the battery state estimation apparatus may generate a single segment vector with respect to the first segment 710, the second segment 720, and the third segment 730. For example, the battery state estimation apparatus may convert the first segment vector 711, the second segment vector 712, and the third segment vector 713 into a first data block, a second data block, and a third data block, respectively. Subsequently, the battery state estimation apparatus may combine the first data block, the second data block, and the third data block, thereby generating the single segment vector.

Figure 8:
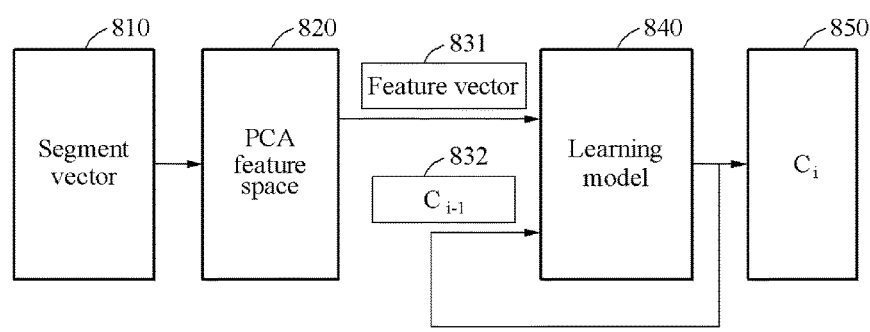
FIG. 8 is a diagram illustrating an example of estimating state of health (SOH) information.

FIG. 8 is a diagram illustrating an example of estimating SOH information. Referring to FIG. 8, a battery state estimation apparatus maps a segment vector 810 to a PCA feature space 820. Although FIG. 8 shows a single segment vector, the segment vector 810, a plurality of segment vectors may be provided depending on an example. The segment vector 810 may include, for example, a segment vector for voltage data, a segment vector for current data, and a segment vector for temperature data.

The battery state estimation apparatus projects the segment vector 810 to a PCA basis matrix, and maps the segment vector 810 to the PCA feature space 820 having a dimension lower than a dimension of the segment vector 810, thereby converting the segment vector 810 into a feature vector 831. When the segment vector 810 is converted into the feature vector 831, a number of operations for estimating a state of a battery may be reduced, and noise may be eliminated from the segment vector 810. In an example, the battery state estimation apparatus may acquire the PCA basis matrix from a preprocessing apparatus.

The battery state estimation apparatus inputs the feature vector 831 to a learning model 840, and estimates a degradation pattern from the learning model 840, thereby estimating a remaining capacity 850 $C_i$ of the battery. The learning model may include at least one of an NN model, an SVM model, and a Gaussian process regression model. In an example, the battery state estimation apparatus may apply a learning parameter to the learning model 840. For example, when the learning model 840 is the NN model, an activation function acquired from the preprocessing apparatus may be applied to the NN model. Also, the battery state estimation apparatus may input a pre-estimated remaining capacity 832 $C_{i-1}$ of the battery and the feature vector 831 to the learning model 840. Through this, an error may be reduced in a result value of a battery remaining capacity estimation. The battery state estimation apparatus may extract SOH information of the battery from the remaining capacity 850 of the battery.

Figure 9:
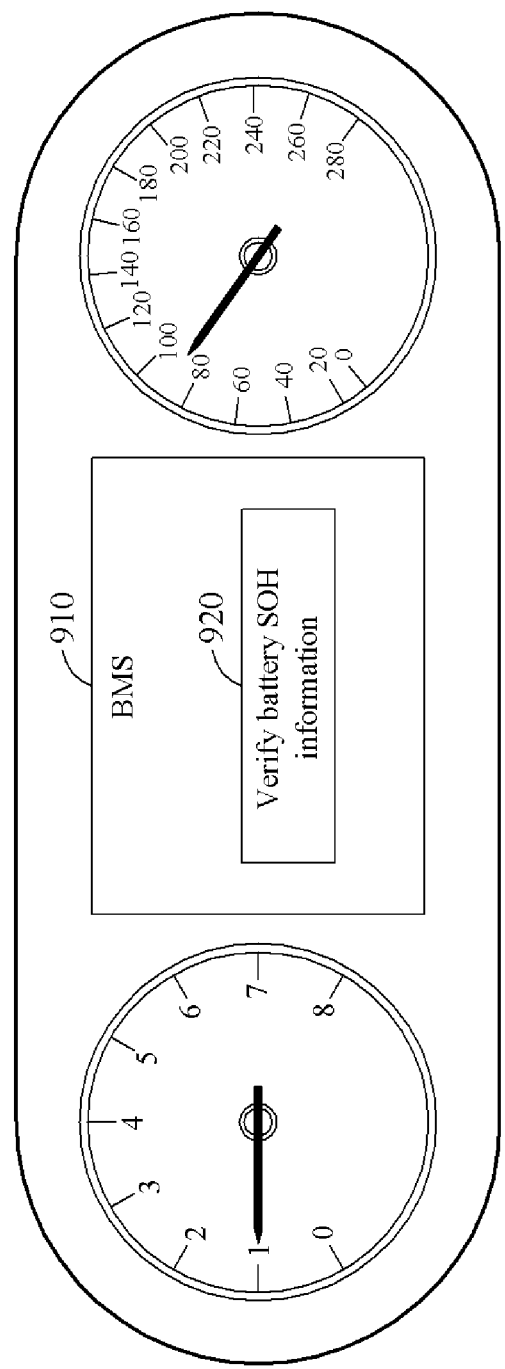
FIG. 9 is a diagram illustrating an example of a user interface that estimates a state of a battery.

FIG. 9 is a diagram illustrating an example of a user interface 910 that estimates a state of a battery. Referring to FIG. 9, a battery control apparatus receives a trigger signal from an external source, and acquires sensing data of the battery in response to the trigger signal. Accordingly, the battery control apparatus may estimate SOH information of the battery in real time, although the battery is partially charged. For example, when an ignition starter of an electric vehicle (EV) including the battery control apparatus and the battery are turned on, an ECU displays the user interface 910 of a BMS on a dashboard. The user interface 910 includes an interface 920 configured to generate the trigger signal. When a user selects the interface 920, the ECU transmits the trigger signal to the battery control apparatus. The battery control apparatus may divide the sensing data based on a predetermined time interval, time-sequentially extract a plurality of segments, each including a predetermined number of items of the divided sensing data, from the sensing data, and estimate the SOH information of the battery based on the plurality of segments. In an example, the battery control apparatus may transmit the extracted SOH information to the ECU. The ECU may display the SOH information received from the battery control apparatus.

Figure 10:
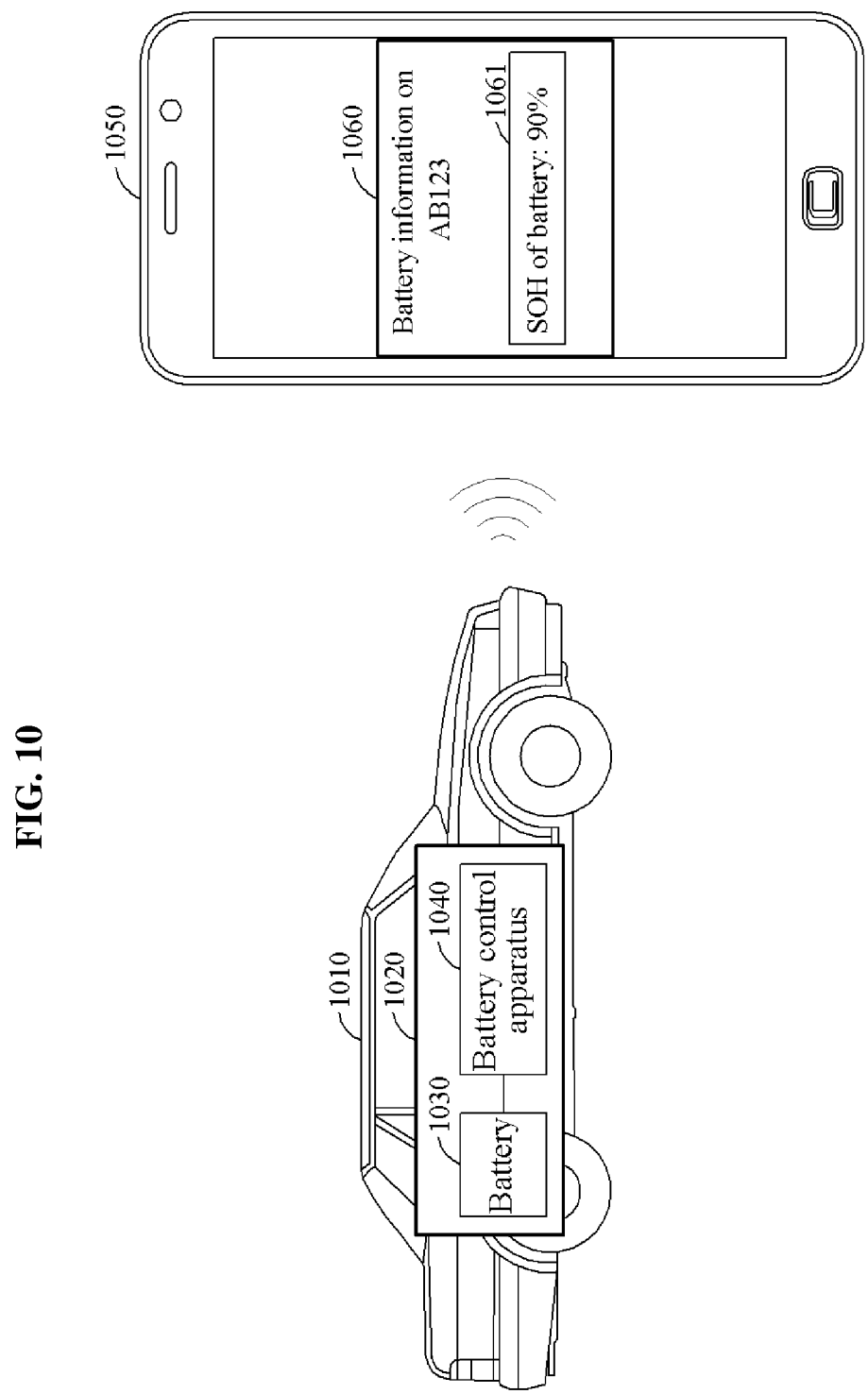
FIG. 10 is a diagram illustrating an example of a user interface that provides a state of a battery.

FIG. 10 is a diagram illustrating an example of a user interface 1060 that provides a state of a battery 1030. Referring to FIG. 10, an EV 1010 includes a battery system 1020. The battery system 1020 includes the battery 1030 and a battery control apparatus 1040. The battery control apparatus 1040 extracts SOH information 1061 of the battery 1030, and transmits the SOH information 1061 of the battery 1030 to a terminal 1050, using a wireless interface.

In an example, the battery control apparatus 1040 may acquire sensing data of the battery 1030. The battery control apparatus 1040 may divide the sensing data based on a predetermined time interval, extract a plurality of segments, each including a predetermined number of items of the divided sensing data, from the sensing data based on a predetermined segment interval, and estimate the SOH information 1061 of the battery 1030 based on the plurality of segments. Each of the segments may be extracted time-sequentially. In an example, the battery control apparatus 1040 may receive a trigger signal from the terminal 1050 via the wireless interface. In response to the trigger signal, the battery 1030 may estimate the SOH information 1061 of the battery 1030. The battery control apparatus 1040 transmits the extracted SOH information 1061 to the terminal 1050 via the wireless interface. The terminal 1050 displays the received SOH information 1061, using the user interface 1060.

Figure 11:
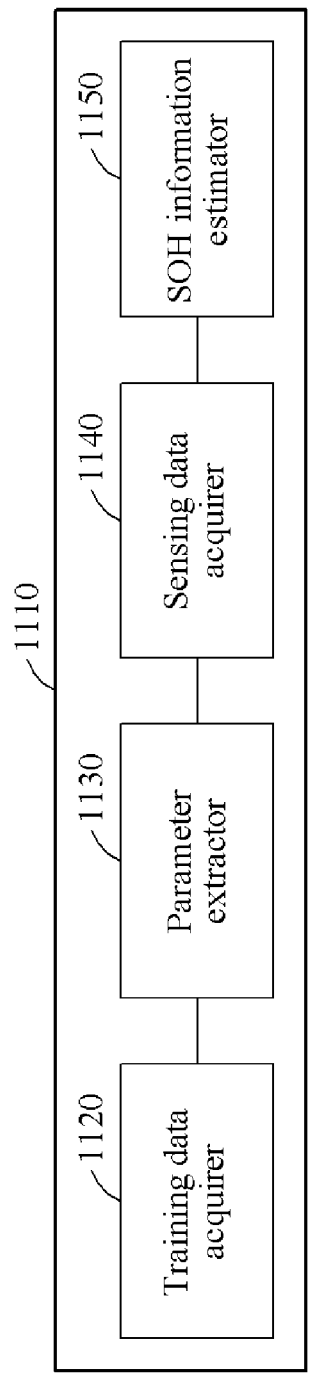
FIG. 11 is a block diagram illustrating still another example of a battery state estimation apparatus.

FIG. 11 is a block diagram illustrating still another example of a battery state estimation apparatus 1110. Referring to FIG. 11, the battery state estimation apparatus 1110 includes a training data acquirer 1120, a parameter extractor 1130, a sensing data acquirer 1140, and an SOH information estimator 1150.

The training data acquirer 1120 acquires a plurality of items of training data of a battery. In an example, the training data acquirer 1120 may acquire the plurality of items of the training data of a single battery, or acquire the plurality of items of the training data of each of a plurality of batteries.

The parameter extractor 1130 divides each item of the training data based on a predetermined time interval. From each item of the training data, the parameter extractor 1130 extracts a plurality of training segments based on a predetermined training segment interval, and extracts a parameter for estimating SOH information of the battery based on the plurality of training segments. Each of the plurality of training segments may include a predetermined number of items of the divided training data, and may be extracted time-sequentially.

The sensing data acquirer 1140 acquires sensing data of the battery.

The SOH information estimator 1150 divides the sensing data based on a predetermined time interval. From the sensing data, the SOH information estimator 1150 extracts a plurality of segments based on a predetermined segment interval. Each of the plurality of segments may include a predetermined number of items of the divided sensing data, and may be extracted time-sequentially. In an example, the number of items of the divided sensing data may be the same as the number of items of the divided training data included in the training segment. Also, the predetermined segment interval may be the same as the predetermined training segment interval.

Detailed descriptions with respect to the battery state estimation apparatus 1110 of FIG. 11 will be omitted for increased clarity and conciseness because the descriptions provided with reference to FIGS. 1 through 10 are also applicable to the battery state estimation apparatus 1110 of FIG. 11.

Figure 12:
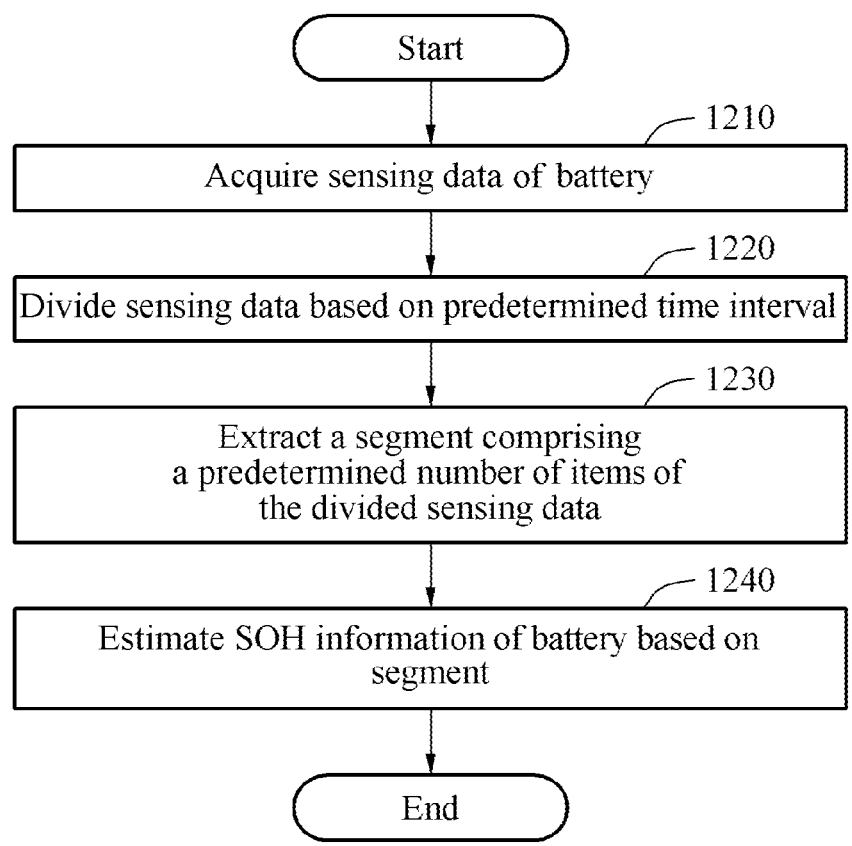
FIG. 12 is a flowchart illustrating an example of a battery state estimation method.

FIG. 12 is a flowchart illustrating an example of a battery state estimation method. Referring to FIG. 12, in operation 1210, a battery state estimation apparatus acquires sensing data of a battery.

In operation 1220, the battery state estimation apparatus divides the sensing data based on a predetermined time interval.

In operation 1230, the battery state estimation apparatus time-sequentially extracts a plurality of segments, each including a predetermined number of items of the divided sensing data, from the sensing data based on a predetermined segment interval.

In operation 1240, the battery state estimation apparatus estimates SOH information of the battery based on the plurality of segments.

Detailed descriptions with respect to the battery state estimation method of FIG. 12 will be omitted for increased clarity and conciseness because the descriptions provided with reference to FIGS. 1 through 11 are also applicable to the battery state estimation method of FIG. 12.

Figure 13:
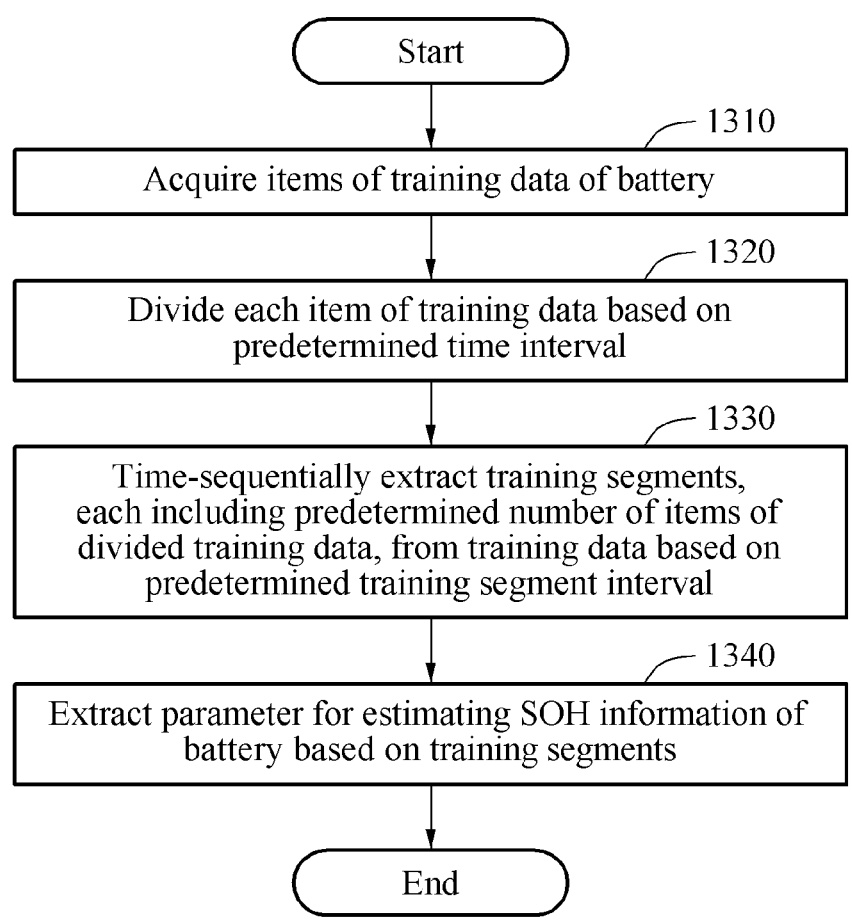
FIG. 13 is a flowchart illustrating an example of a preprocessing method of estimating a state of a battery.

FIG. 13 is a flowchart illustrating an example of a preprocessing method of estimating a state of a battery. Referring to FIG. 13, in operation 1310, a preprocessing apparatus acquires a plurality of items of training data of the battery.

In operation 1320, the preprocessing apparatus divides each item of the training data based on a predetermined time interval.

In operation 1330, the preprocessing apparatus time-sequentially extracts a plurality of training segments, each including a predetermined number of items of the divided training data, from the training data based on a predetermined training segment interval.

In operation 1340, the preprocessing apparatus extracts a parameter for estimating SOH information of the battery based on the plurality of training segments.

Detailed descriptions with respect to the preprocessing method of estimating the state of the battery in FIG. 13 will be omitted for increased clarity and conciseness because the descriptions provided with reference to FIGS. 1 through 11 are also applicable to the preprocessing method of estimating the state of the battery in FIG. 13.

Figure 14:
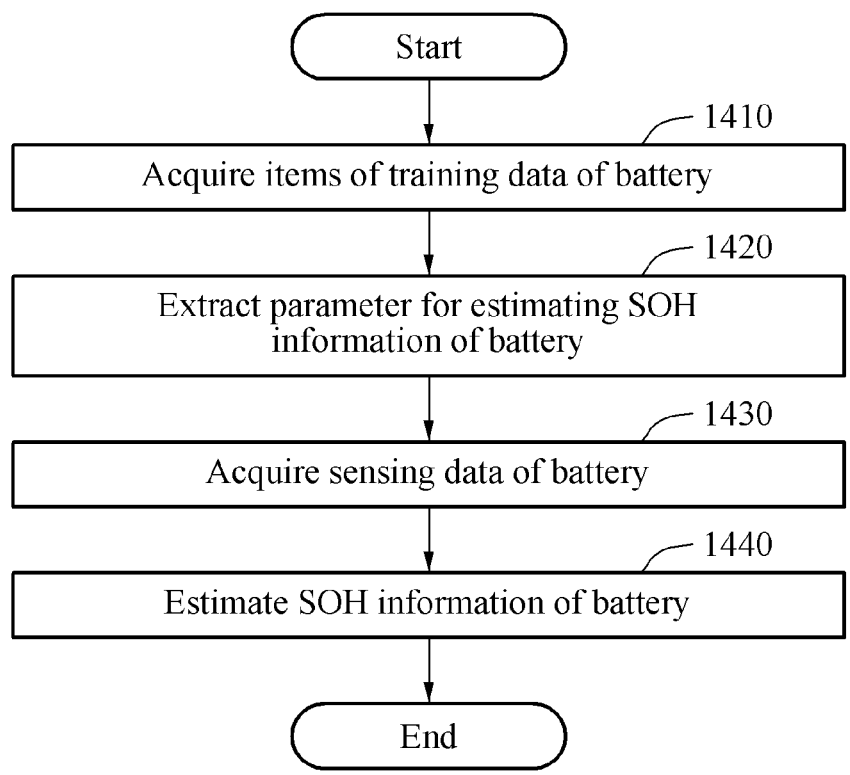
FIG. 14 is a flowchart illustrating another example of a battery state estimation method.

FIG. 14 is a flowchart illustrating another example of a battery state estimation method. Referring to FIG. 14, in operation 1410, a battery state estimation apparatus acquires a plurality of items of training data of a battery.

In operation 1420, the battery state estimation apparatus divides each item of the training data based on a predetermined time interval, extracts a plurality of training segments, each including a predetermined number of items of the divided training data, from the training data based on a predetermined training segment interval, and extracts a parameter for estimating SOH information of the battery based on the plurality of training segments. In operation 1420, the battery state estimation apparatus may extract each of the training segments time-sequentially.

In operation 1430, the battery state estimation apparatus acquires sensing data of the battery.

In operation 1440, the battery state estimation apparatus divides the sensing data based on the predetermined time interval, extracts a plurality of segments, each including a predetermined number of items of the divided sensing data, from the sensing data based on a predetermined segment interval, and estimates the SOH information of the battery, using the parameter extracted, based on the plurality of segments. In operation 1440, the battery state estimation apparatus may extract each of the segments time-sequentially.

Detailed descriptions with respect to the battery state estimation method of FIG. 14 will be omitted for increased clarity and conciseness because the descriptions provided with reference to FIGS. 1 through 11 are also applicable to the battery state estimation method of FIG. 14.

The various units, modules, elements, and methods described above may be implemented using one or more hardware components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

As a non-exhaustive illustration only, a terminal described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blue-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state estimation apparatus comprising:
   a sensing data acquirer configured to acquire sensing data of a battery; and
   a state of health (SOH) information estimator configured to
      divide the sensing data based on a predetermined time interval,
      extract a segment comprising a predetermined number of items of the divided sensing data, and
      estimate SOH information of the battery based on a changing pattern of the divided sensing data included in the segment, and previous SOH information corresponding to a previous segment.

2. The apparatus of claim 1, wherein the sensing data comprises any one or any combination of voltage data, current data, temperature data, pressure data, and humidity data of the battery, which are sensed by a sensor configured to sense the battery.

3. The apparatus of claim 1, wherein the sensing data acquirer is configured to:
   update the sensing data based on an update cycle.

4. The apparatus of claim 1, wherein the sensing data acquirer is configured to:
   acquire the sensing data based on a control signal received from an external source.

5. The apparatus of claim 1, wherein the SOH information estimator is configured to:
   generate a segment vector based on the divided sensing data included in the segment.

6. The apparatus of claim 5, wherein the SOH information estimator is configured to:
   generate the segment vector for each item of the sensing data.

7. The apparatus of claim 5, wherein the SOH information estimator is configured to:
   map the segment vector to a feature space of which a dimension is lower than a dimension of the segment vector, based on a predetermined mapping parameter; and
   convert the mapped segment vector into a feature vector having a dimension equal to the dimension of the feature space.

8. The apparatus of claim 7, wherein the SOH information estimator is configured to:
   apply the feature vector and a predetermined learning parameter to a predetermined learning model to estimate a remaining capacity of the battery; and
   estimate the SOH information of the battery based on the remaining capacity of the battery.

9. The apparatus of claim 8, wherein the SOH information estimator is configured to:
   apply the feature vector, a pre-estimated remaining capacity of the battery, and the predetermined learning parameter to the predetermined learning model to estimate the remaining capacity of the battery.

10. The apparatus of claim 8, wherein the SOH information estimator is configured to:
    acquire either one or both of the predetermined mapping parameter and the predetermined learning parameter from an external source.

11. The apparatus of claim 1, wherein a size of the segment is between 1000 and 9000 seconds.

12. The apparatus of claim 11, wherein the size of the segment is between 3000 and 9000 seconds.

13. The apparatus of claim 1, wherein the SOH information estimator is configured to extract the segment from two or more of voltage data, current data, temperature data, pressure data, and humidity data of the battery.

14. A battery state estimation apparatus comprising:
    a sensing data acquirer configured to acquire sensing data of a battery; and
    a state of health (SOH) information estimator configured to:
       periodically estimate SOH information of the battery and
       perform the estimating based on a changing pattern of processed data generated by processing the sensing data and previous SOH information of the battery estimated in a previous cycle.

15. The apparatus of claim 14, further comprise a buffer configured to store the previous SOH information.

16. The apparatus of claim 14, wherein the processed data comprises any one or any combination of divided sensing data into which the sensing data is divided based on a predetermined time interval, a segment including a predetermined quantity of divided sensing data, a segment vector generated based on the divided sensing data included in the segment, and a feature vector into which the segment vector is converted.

17. The apparatus of claim 16, wherein the SOH information estimator is configured to generate the segment based on an estimation cycle of the SOH information.

18. The apparatus of claim 14, wherein the SOH information estimator is configured to apply the previous SOH information and the processed data to a learning model, and estimate the SOH information of the battery based on a result of the applying.

19. A battery state estimation method comprising:
    acquiring sensing data of a battery;
    dividing the sensing data based on a predetermined time interval;
    extracting a segment comprising a predetermined number of items of the divided sensing data; and
    estimating state of health (SOH) information of the battery based on a changing pattern of the divided sensing data included in the segment, and previous SOH information corresponding to a previous segment.

20. An apparatus comprising:
a processor configured to
  divide data of a battery into items based on a predetermined time interval,
  extract a segment comprising a predetermined number of the items, and
  estimate a remaining capacity of the battery based on a changing pattern of the divided data included in the segment, and previous SOH information corresponding to a previous segment.

21. The apparatus of claim 20, wherein the processor is configured to:
generate a vector comprising the predetermined number of the items included in the segment; and
estimate the remaining capacity based on the vector.

22. The apparatus of claim 20, wherein the processor is configured to:
estimate the remaining capacity of the battery during a partial charging or discharging of the battery.

23. The apparatus of claim 20, wherein the processor is configured to:
estimate the remaining capacity of the battery further based on a pre-estimated remaining capacity of the battery.

* * * * *